(12) United States Patent
Tsuiki et al.

(10) Patent No.: US 6,586,983 B2
(45) Date of Patent: Jul. 1, 2003

(54) SIGNAL PHASE ADJUSTMENT CIRCUIT TO SET OPTIMUM PHASE

(75) Inventors: Jun Tsuiki, Yokohama (JP); Toshiyuki Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/102,768

(22) Filed: Mar. 22, 2002

(65) Prior Publication Data

US 2002/0097078 A1 Jul. 25, 2002

Related U.S. Application Data

(62) Division of application No. 09/732,718, filed on Dec. 11, 2002.

(30) Foreign Application Priority Data

Dec. 10, 1999 (JP) .............................. 11-351589

(51) Int. Cl.[7] .............................................. H03H 11/16
(52) U.S. Cl. ..................... 327/233; 327/234; 327/236; 327/7
(58) Field of Search .............................. 327/233, 234–6, 327/244, 7, 8, 17, 333; 375/364, 355

(56) References Cited

U.S. PATENT DOCUMENTS 3,963,877 A * 6/1976 Miyazaki et al. .... 178/69.5 TV
5,099,477 A * 3/1992 Taniguchi et al. ............. 370/97
5,414,414 A * 5/1995 Suzuki .................. 340/825.01
5,995,539 A * 11/1999 Miller ......................... 375/222
6,128,319 A * 10/2000 Ngai .......................... 370/516

FOREIGN PATENT DOCUMENTS

JP          52-4724         1/1977
JP          11-112483       4/1999

* cited by examiner

Primary Examiner—Timothy P. Callahan
Assistant Examiner—An T. Luu
(74) Attorney, Agent, or Firm—Staas & Halsey LLP

(57) ABSTRACT

A signal phase adjustment circuit to set an optimum phase by adjusting the difference in delay times between signal lines even when the distribution of the amount of phase modification that can be received normally is divided into a plurality of continuous regions. The amount of phase modification of the transmitted signal is allowed to fluctuate during one cycle of the operational frequency of the circuit. Determination of whether or not the reception signal during this interval can be received is continued, and the distribution of amount of phase modification that can be normally received is detected. The detected amount of phase modification defines continuous regions, and an optimum phase region is specified by selecting a region having a width of a specified value or more or the region having the greatest width. The optimum amount of sampling phase modification is determined from the upper and lower limit values of this region.

5 Claims, 11 Drawing Sheets

SIGNAL PHASE ADJUSTMENT CIRCUIT TO SET OPTIMUM PHASE

CROSS REFERENCE TO RELATED APPLICATIONS

This application is a divisional of application Ser. No. 09/732,718, filed Dec. 11, 2002, now allowed.

BACKGROUND OF THE INVENTION

1. Field of the Invention

The present invention relates to a device to transfer data between a plurality of devices that utilize high frequency. More specifically, the present invention is related to a phase adjustment device that realizes data transmission by adjusting the clock phase of a reception side device, and to an adjustment mechanism that makes the optimum clock phase adjustment. The present invention may, for example, be utilized in communications between processors in multiprocessor systems.

2. Description of the Related Art

Conventional signal transmission systems are disclosed in, for example, Japanese Unexamined Patent Publication No. H11-136312 and Japanese Unexamined Patent Publication No. H11-112483.

FIG. 2 illustrates the signal transmission system disclosed in Japanese Unexamined Patent Publication No. H11-136312. As shown in FIG. 2, the signal transmission system includes a transmission side device 20 and a reception side device 30 which operate synchronously by the same clock generator 51. The transmission side device 20 includes a transmission side pattern generator 21 that generates a signal having a specified pattern in order for the reception side device 30 to determine whether or not the transmission synchronization is correct. The signal having a specified pattern generated by the pattern generator 21 is supplied to output flip-flops 22, which are provided corresponding to each signal line transmitted on a transmission route 10. Pattern signals transmitted to the transmission route 10 are received by the reception side device 30 and are input into input flip-flops 33 corresponding to each signal line. The clock signal transmitted from the clock generator 51 undergoes phase modification by a sampling phase adjustment circuit 31, and is input to the flip-flops 33 as a clock signal that causes the operation of the input flip-flops 33. A control unit 52 generates a phase adjustment signal 41 to designate an amount of modification for phase modification.

The reception side device 30 includes a pattern generator 35. The pattern generator 35 generates the same pattern signal as the pattern generator 21 of the transmission side device 20. The signal having a specified pattern generated by the pattern generator 35 passes through a delay circuit 38 and is input to a comparator 39. The signals output from the input flip-flops 33 pass through respective flip-flops 34 for synchronization and are input to the comparator 39. The signals pass through the synchronization flip-flops 34 because there is the high possibility that the operational clock of the input flip-flops 33 is not synchronized with the operational clock inside the reception side device 30. The synchronization flip-flops 34 are provided to heighten circuit stability and for the comparator 39 to conduct reliable comparisons.

The control unit 52 attempts to synchronize the data transmission by providing an amount of signal delay based on the transmission route 10, and by designating an amount of phase modification that matches the amount of delay to the sampling phase adjustment circuit 31. Information indicating whether or not the two input signals input to the comparator 39 agree is transmitted from the comparator 39 to the control unit 52. The control unit 52 can use this information to determine whether or not the reception side device 30 as a whole is operating normally in relation to the transmission of data signals.

FIG. 3 illustrates the signal transmission system described in Japanese Unexamined Patent Publication No. H11-112483. As shown in FIG. 3, a transmission side device 60 and a reception side device 70 operate synchronously with the same clock 51. The transmission side device 60 includes a pattern generator 61 that transmits test patterns for synchronization adjustment to the reception side device 70 to adjust the phase discrepancy between a plurality of signals transmitted by a transmission route 10 and the test pattern for phase adjustment, which is conducted to adjust the clock phase of the transmitted signal.

A signal having a specified pattern is generated by the pattern generator 61 and supplied to output flip-flops 22 that are provided corresponding to the plurality of signals transmitted by the transmission route 10. The pattern signals transmitted by the transmission route 10 are received by the reception side device 70, and are input into respective sampling signal phase adjustment circuits 76 for every signal line. The sampling signal phase adjustment circuits 76 change the sampling phase according to an adjustment signal designated by a control unit 72. The signals that are output from the respective sampling signal phase adjustment circuits 76 are respectively input into synchronization adjustment circuits 73.

The control unit 72 controls the synchronization adjustment circuits 73, and the amount of transmission delay for each signal line is controlled and input into a reception determination circuit 75. The reception determination circuit 75 detects the delay time discrepancy between signal lines by using the test pattern for phase adjustment to determine whether or not all of the plurality of input signals are the same. Moreover, the reception determination circuit 75 detects the phase shift delay of the transmission route by determining whether or not the received signal is the same as the test pattern for synchronization adjustment. From the results of the above detection, the control unit 72 designates the amount of adjustment to the signal phase adjustment circuit 76 and the synchronization adjustment circuit 73 in order that the reception side device 70 can receive signals normally.

At present, if a device having a low operational frequency must be utilized, when communicating between devices, there is no problem with the signal delay becoming hidden in the clock gap, even if using simple adjustment circuits such as the conventional adjustment circuits. However, in order to notably improve operational frequency, future information processing devices will have significant problems with the delay of signals and the amount of delay between signals, even when transmitting slight distances like those between neighboring circuit boards. Moreover, it is expected that this problem will become even more pronounced in the future as the operational frequencies of processors improve.

Specifically, structural errors during manufacture, such as variations in materials and valid line lengths, or fluctuation errors caused by changes of environmental conditions, such as the temperature and humidity of the signal lines, are the cause of: (1) transmitted signals fluctuating in conjunction with the passage of time; and (2) signal fluctuations causing fluctuation in the amount of phase modification necessary for the reception side device to receive signals normally. It is not possible to have normal signal reception locally when the phase is on the boundary of the transmission cycle, when a specific phase has great noise, or when a phase cannot fulfill the timing restriction for signal transmission from a circuit that is operating according to one clock signal to a circuit that is operating according to another clock signal.

FIG. 4A illustrates a range of what is conventionally considered to be the transmittable amount of phase modification. More particularly, the horizontal axis in FIG. 4 indicates the amount of phase modification, and, the further to the right along the horizontal axis in FIG. 4, the greater the amount of phase modification. As shown in FIG. 4A, point A is a point at which the amount of phase modification is zero (0), specifically, the point at which no reception signal phase modification is conducted, and point B is a point at which the amount of phase modification becomes one (1) cycle. As shown in FIG. 4A, the range of the dashed lines enclosed by the elliptical framework corresponds to the range of the amount of transmittable phase modification, and the part that is indicated by a straight line is the range of the amount of non-transmittable phase modification.

As indicated in FIG. 4A, it appears that, conventionally, the range of the amount of transmittable phase modification exists only in one place, while the value of the amount of phase modification fluctuates during one clock cycle. For this reason, the phase adjustment for each signal line is set to the center point of the amount of phase modification that can be received normally. The hidden assumption is that the distribution of the transmittable adjustment value is distributed to become a single continuous region.

SUMMARY OF THE INVENTION

FIG. 4B illustrates the range of transmittable phase adjustment discovered by the present inventors. As shown in FIG. 4B, as the operational frequency of the circuit improves, there are a plurality of ranges of the amount of transmittable phase modification while the value of the amount of phase modification fluctuates one (1) cycle. The widths of the various serial regions vary. This is because, as the operational frequency of the circuit improves, the range of the amount of adjustment that is conventionally considered to be transmittable is actually locally segmented into a plurality of parts. Depending on the viewpoint, it can be said that the range of the amount of transmittable phase modification may be divided into a plurality of regions. Further, this generates the phenomenon that the transmittable regions that have been divided into a plurality of parts each have their own differing widths.

For this reason, if the phase is adjusted to the center point of the optional range of the amount of transmittable phase modification that was discovered unintentionally, for example, if the phase is adjusted in the state indicated FIG. 4B, there is the possibility of selecting the middle region. If the middle region is selected, if outside disturbances cause the signal to fluctuate even a tiny amount, the reception side device will fluctuate outside the range of the amount of phase modification with the reception signal simply being received normally, and, in this situation, there is the problem that stability will be lost.

The present invention provides a signal phase adjustment circuit that can adjust the difference in delay times between signal lines and set an optimum phase even if the distribution of the amount of phase modification that can be normally received is divided into a plurality of continuous regions.

The present invention solves the problems described above by detecting a region having a width of a specified value or more from among a plurality of regions in a series of amounts of receivable phase modification, and utilizes the detected region to set the amount of phase modification.

In accordance with embodiments of the present invention, a signal phase adjustment circuit comprises a clock phase modification circuit to modify a phase of an input clock signal and to output a phase modified clock signal; an input signal adjustment circuit to receive an input data signal and to transmit the data signal, and which operates based on the phase modified clock signal output from the clock phase modification circuit; a reception determination unit to determine a reception status of the data signal transmitted from the input signal adjustment circuit based on a pre-set fixed pattern signal and the data signal transmitted from the input signal adjustment circuit; and a control unit to control an amount of phase modification of the clock phase modification circuit based on the determination results of the reception determination unit, wherein the control unit determines an amount of phase modification from upper and lower limits of an amount of phase modification of a region, among stable phase regions, having a continuous region width of a specified value or more.

The reception determination unit determines that the reception status of the data signal is normal if the pre-set fixed pattern signal and the data signal transmitted from the input signal adjustment circuit agree, and the control unit selects the amount of phase modification based on the normal status of received pattern signals.

In accordance with embodiments of the present invention, a plurality of data signals are input to the input signal adjustment circuit, and the input signal adjustment circuit further comprises an input delay circuit to delay the respective input data signals by a specified amount, wherein the control unit detects stable phase regions of the respective input data signals having a continuous region width of a specified value or more, and wherein the control unit comprises an amount of delay modification determination device and a device to determine the amount of phase modification, wherein the amount of delay modification determination device determines a phase modification standard value as a maximum value from among minimum amounts of phase modification of continuous regions, wherein the amount of delay modification determination device establishes an amount of delay for each input data signal, such that a minimum amount of phase modification of a region, among the stable phase regions, having a continuous region width of the specified value or more agrees with the phase modification standard value, wherein the device to determine the amount of phase modification determines the optimum amount of sampling phase modification from a lower limit and an upper limit of the amount of phase modification of a location that can receive all signals normally, among the continuous regions wherein all the signals are the same, and having a continuous region width of a specified value or more.

In accordance with embodiments of the present invention, the control unit comprises a phase modification designation unit to designate an amount of phase modification in ascending or descending order from a first value to a second value in relation to the clock phase modification circuit, and to detect a minimum amount of phase modification and a maximum amount of phase modification of the stable phase regions having a continuous region width that can receive signals normally of a specified value or more.

In accordance with embodiments of the present invention, the reception determination unit comprises a selection circuit to select a signal from the plurality of input signals, and to determine that a reception state is normal when the selected signal agrees with a signal having a predetermined fixed pattern, and wherein the control unit detects, for each signal selected by the selection circuit, a region having a continuous region width of a specified value or more, from among the regions having an amount of phase modification that can be received normally.

In accordance with embodiments of the present invention, instead of determining the amount of phase modification from the lower limit and upper limits of the amount of phase modification of a region, among stable phase regions, having a continuous region width of a specified value or more, rather, the amount of phase modification is determined from the lower limit and upper limit amounts of the amount of phase modification of a location that can receive all signals normally, among the continuous regions wherein all the signals are the same, and having a largest continuous region width.

In accordance with embodiments of the present invention, a signal synchronization transmission system comprises a transmission device to output specified pattern signals; a transmission route to transmit the pattern signals; and a reception device to receive signals propagated from the transmission route, wherein the transmission device transmits pre-set specified pattern signals to the transmission route, and the reception device comprises a signal phase adjustment circuit generating a fixed pattern signal which is the same as the pre-set specified pattern signals transmitted by the transmission device.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DESCRIPTION OF THE PREFERRED EMBODIMENTS

Figure 1:
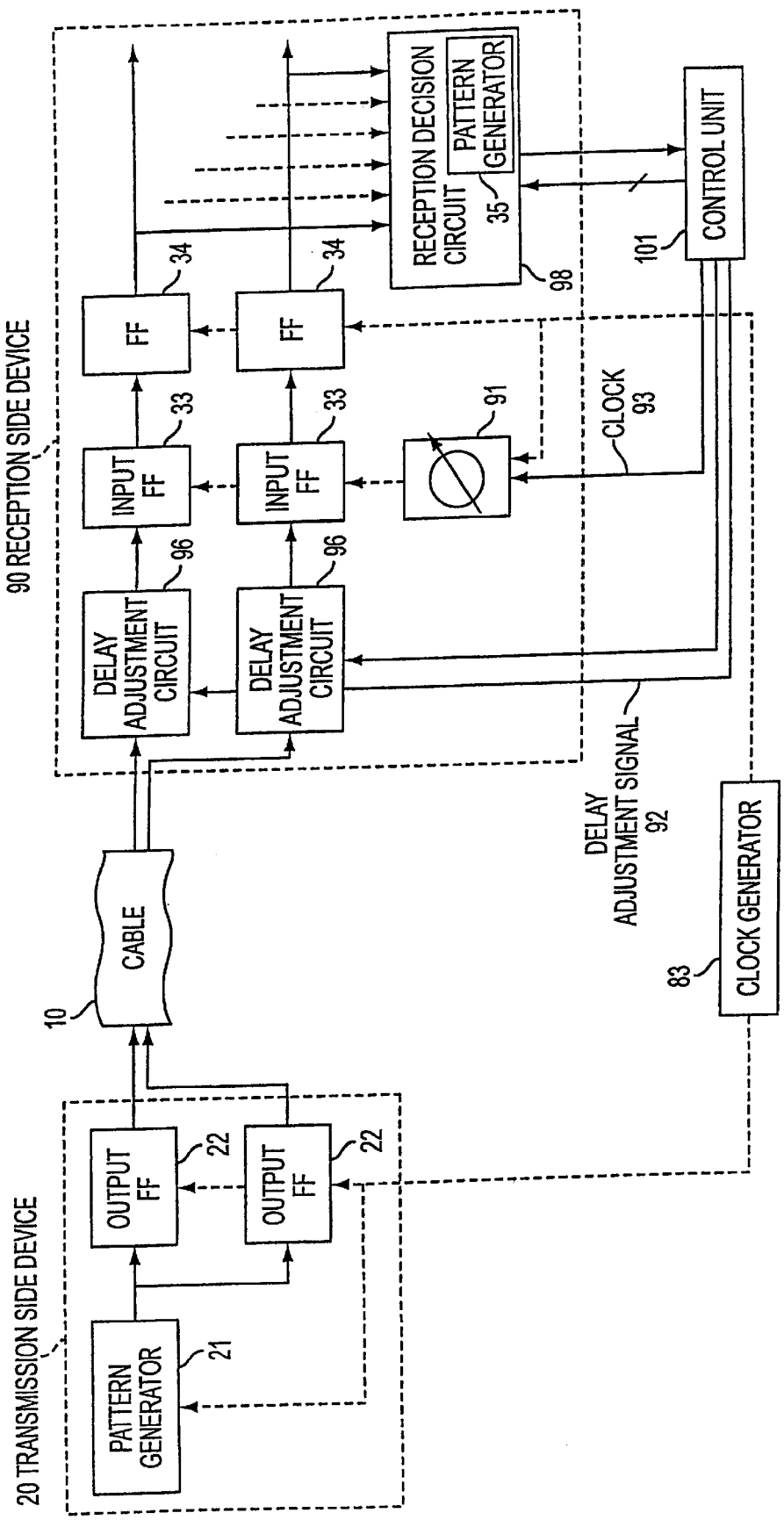
FIG. 1 is a block diagram of a phase adjustment circuit in accordance with embodiments of the present invention.
Figure 2:
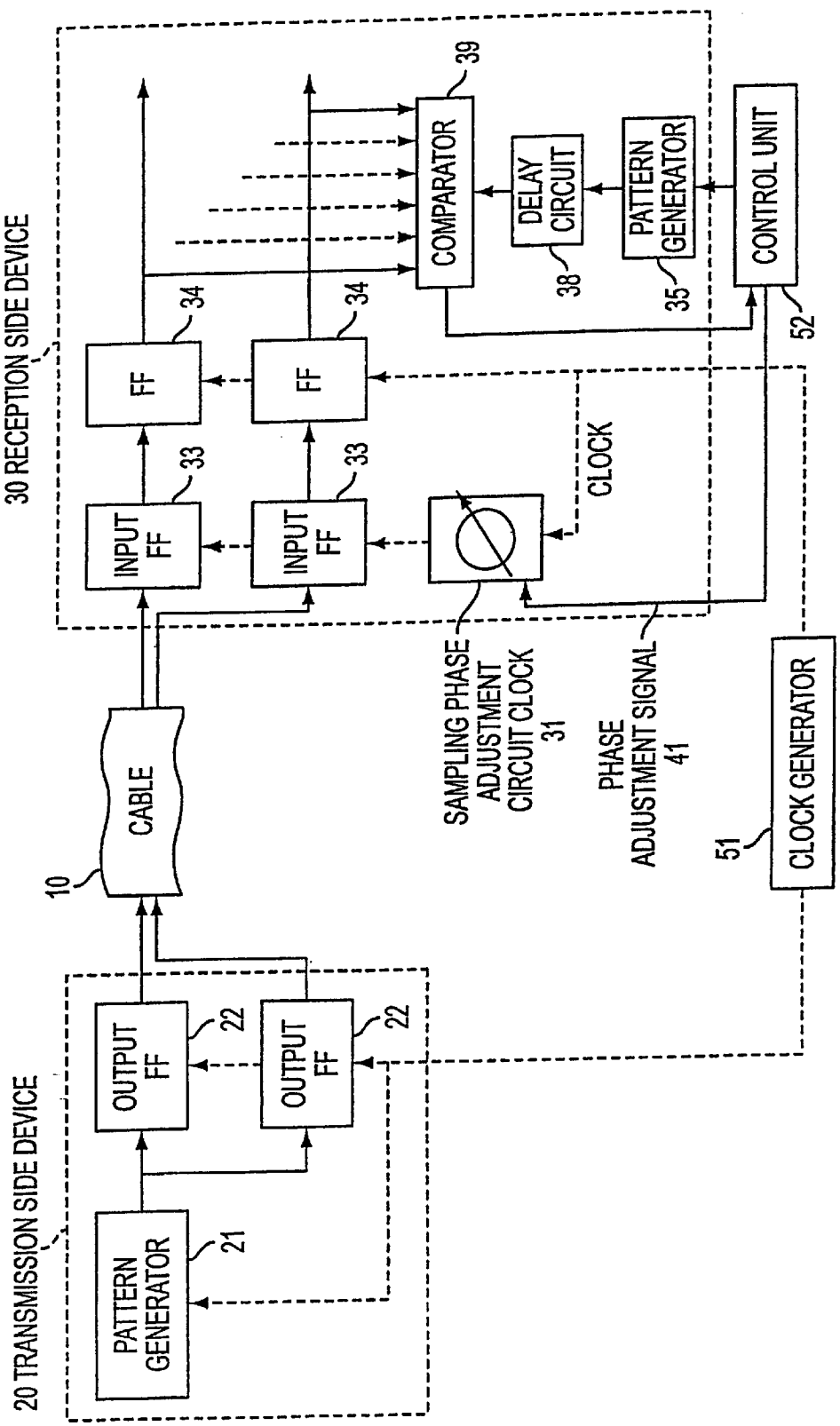
FIG. 2 is a block diagram of a conventional phase adjustment circuit.
Figure 3:
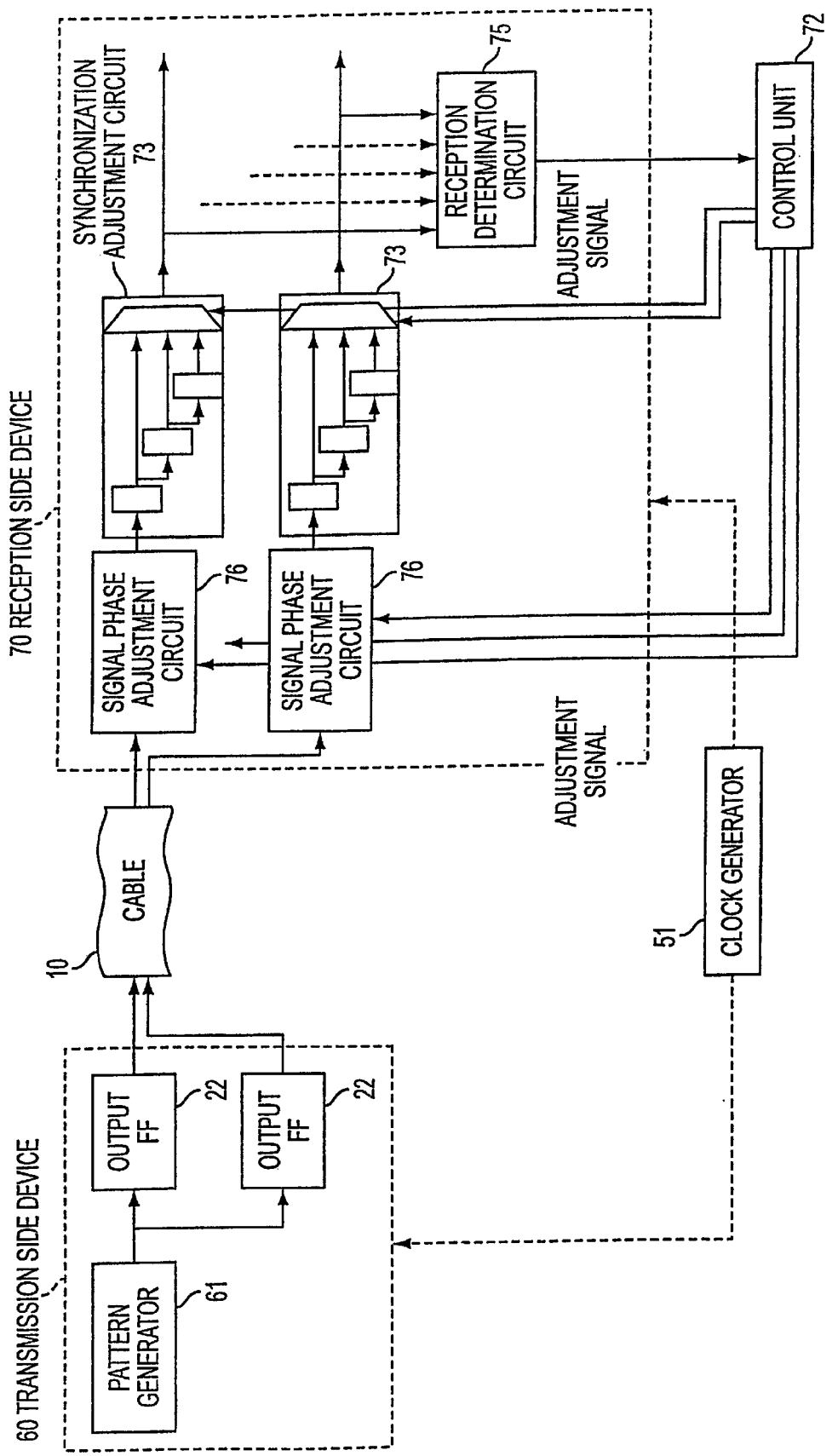
FIG. 3 is a block diagram of a conventional phase adjustment circuit.
Figure 4A:
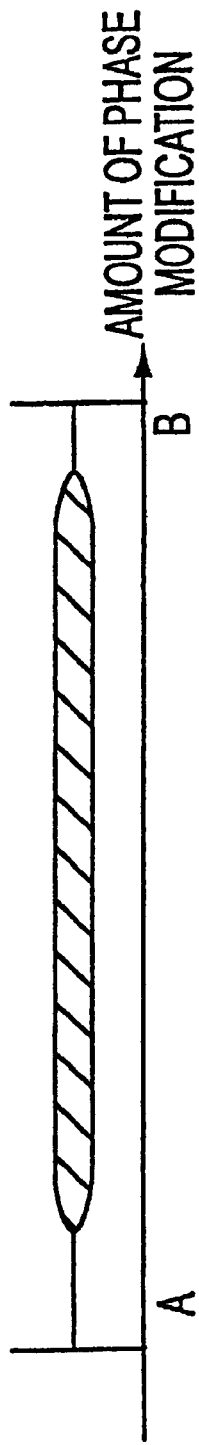
FIG. 4A is a diagram illustrating a conventional range of transmittable amount of phase modification.
Figure 4B:
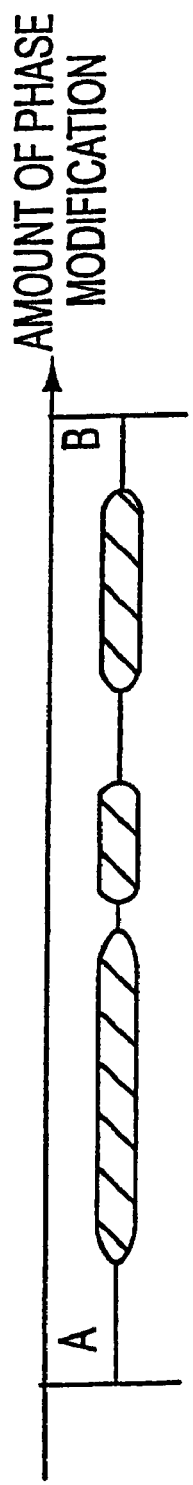
FIG. 4B is a diagram illustrating a range of transmittable phase adjustment discovered by the present inventors.

Reference will now be made in detail to the preferred embodiments of the present invention, examples of which are illustrated in the accompanying drawings, wherein like reference numerals refer to like elements throughout.

A signal phase adjustment circuit in accordance with embodiments of the present invention will be described below with reference to FIG. 1, which is a block diagram of the signal phase adjustment circuit.

As shown in FIG. 1, a clock generator 83 generates a clock signal which is provided to a transmission side device 20 and a reception side device 90. The clock signal provided to the transmission side device 20 and reception side device 90 has the same phase and same frequency. Further, although not shown in the FIG. 1, the same clock as the clock that is input to the flip-flops 34 for synchronization is supplied to the circuits of the reception side device 90.

The transmission side device 20 includes a pattern generator 21 which generates fixed pattern signals used to confirm whether the reception side device 90 is receiving signals normally. The fixed pattern signals that are generated by the pattern generator 21 are input into output flip-flops 22 which correspond to the various signal lines comprising a transmission route 10. All of the flip-flops 22 operate in synchronization with the same clock signal in order for the output flip-flops 22 to output signals simultaneously from corresponding signal lines. Further, although FIG. 1 illustrates that the transmission route 10 comprises a plurality of signal lines for transmission, of course, the transmission route 10 may have only one signal line.

The reception side device 90 includes delay adjustment circuits 96 which receive the signals propagated through the transmission route 10. The delay adjustment circuits 96 adjust the amount of delay of the outputs for each signal line according to instructions from a control unit 101. The delay adjustment circuit 96 is not a device that causes signals to be delayed by one clock unit, as in the conventional example. Rather, the delay unit of the delay adjustment circuit 96 is an amount that is about ⅒ the length of the clock cycle.

Figure 5:
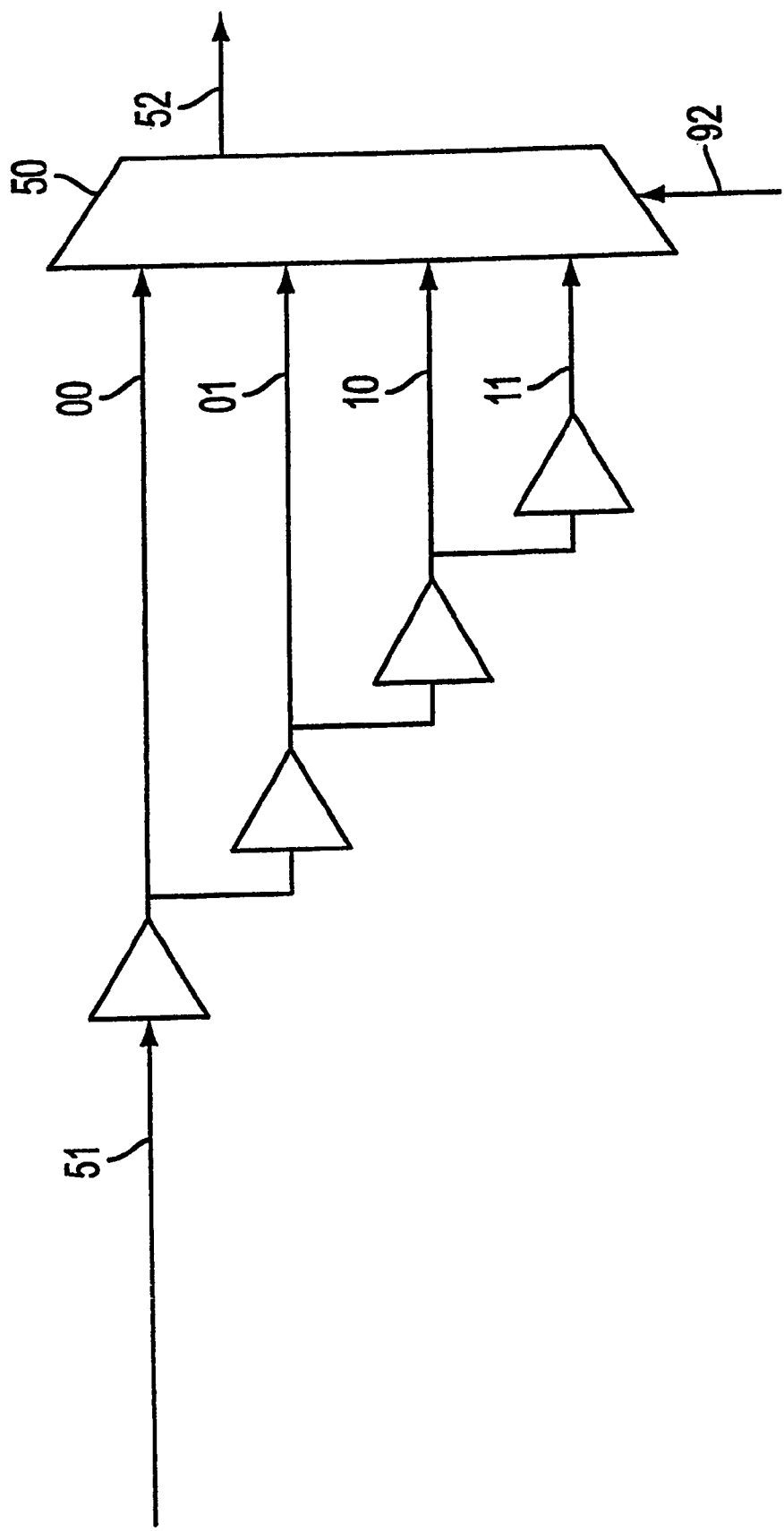
FIG. 5 is a diagram illustrating a delay circuit in accordance with the present invention.

FIG. 5 is a diagram illustrating details of the delay adjustment circuit 96 shown in FIG. 1. As shown in FIG. 5, signals 51 that are input from the transmission route 10 to the delay adjustment circuit 96 are input to a plurality of delay elements to produce a one (1) clock delayed signal 00, a two (2) clock delayed signal 01, a three (3) clock delayed signal 10, and a four (4) clock delayed signal 11. The outputs from the plurality of delay elements are input into a selection circuit 50. A delay adjustment signal 92 from a control unit (not shown) is input to the selection circuit 50. The selection circuit 50 selects, from among the plurality of delay signals, the signals corresponding to the delay adjustment signals 92 from the control unit, and outputs the selected signals as output signals 52.

The signals output from the delay adjustment circuits 96 are input to respective input flip-flops 33. The clock signals that cause the input flip-flops 33 to operate are signals wherein the clock signals transmitted from the clock generator 83 have been phase modified by a sampling phase adjustment circuit 91. The control unit 101 generates a phase adjustment signal 93, designating the amount of phase modification by the sampling phase adjustment circuit 91. The signals output from the input flip-flops 33 pass through the synchronization flip-flops 34 and are input into a reception decision circuit 98. The synchronization flip-flops 34 pass signals in the same manner as the conventional synchronization flip-flops.

The reception decision circuit 98 of the reception side device 90 determines whether or not the amount of delay and the amount of phase modification of the received signals are suitable values. The reception decision circuit 98 includes a pattern generator 35. The pattern generator 35 generates the same pattern signal as the pattern generator 21 of the transmission side device 20. The reception decision circuit 98 compares the output from the synchronization flip-flops 34 with the output from the pattern generator 35, and, if both are the same, notifies the control unit 101 that reception is normal.

When beginning signal transmission, the control unit 101 sends instructions to the delay adjustment circuit 96 to make the amount of delay the minimum. The control unit 101 selects one of the plurality of signals input from the synchronization flip-flops 34 and detects the amount of phase modification that can be received normally. In order to detect the amount of phase modification that can be received normally, the control unit 101 sends instructions to the sampling phase adjustment circuit 91 to gradually increase the amount of phase modification, and monitors the notification from the reception decision circuit 98 that reception is normal.

The control unit 101 stops monitoring the reception decision circuit 98 before it modifies the phase amount by as much as one clock cycle of the operational frequency. The control unit 101 recognizes the distribution of the continuous regions of the amount of phase modification that can be received normally (referred to hereinafter as "stable phase regions") based on the normal indications from the reception decision circuit 98 during this time. From among the plurality of stable phase regions that exist, the control unit 101 selects a region having a width of a specified value or more, and specifies the selected region as the optimum phase region.

Further, the specified value, which is compared with the widths of the stable phase regions to select the region having the width of the specified value or more, is determined by the variations of the elements that comprise the circuit and the operational frequency of the circuit. From these values, a range is derived wherein the phase of the signals and the amount of delay of the signals fluctuate because of external disturbances, and the specified value is set to a value such that the stable phase region is broader than the fluctuation region. Of course, the fluctuation range will vary for each actual device. However, the maximum fluctuation range may be assumed based on the range of error of the elements that comprise the device.

Moreover, in the situation in which there is no stable phase region having a width of the specified value or more, the selected stable phase region may be the region having the greatest width, rather than the region having a width of the specified value or more. Because the specified value is originally a value determined by assuming the worst case, even if the stable phase region having the maximum width does not have a width of the specified value or more, few problems result.

The control unit 101 makes the above-described determination for all signal lines, and after making the determinations, the control unit 101 decides on the optimum phase region for the reception side device 90 based on the stable phase regions specified for all the signal lines. The control unit 101 completes the phase adjustment by designating the amount of delay to the delay adjustment circuit 96 such that the minimum amount of phase modification of the respective optimum phase regions for all signal lines is the same value.

With the settings of the delay adjustment circuit 96 complete, the control unit 101 decides on the optimum amount of sampling phase modification from the maximum and minimum amounts of phase modification of the phase regions that can receive signals normally (stable phase regions) in all signal lines.

As described above, the signal phase adjustment device includes a plurality of signal lines for reception. However, if there is one signal line for reception, the adjustment of the amount of delay between signal lines becomes unnecessary. Nonetheless, the basic approach does not need to be changed. In the case there is only one signal line, the delay adjustment circuit 96 provided in the reception side device 90 may be omitted.

In accordance with the signal phase adjustment circuit of the present invention, it is possible for the reception side device 90 to select the amount of phase adjustment that will be the strongest in relation to external disturbances, and the stability of the device can be improved.

Embodiments of the present invention will now be described in more detail below with reference to FIGS. 6–13.

Figure 6:
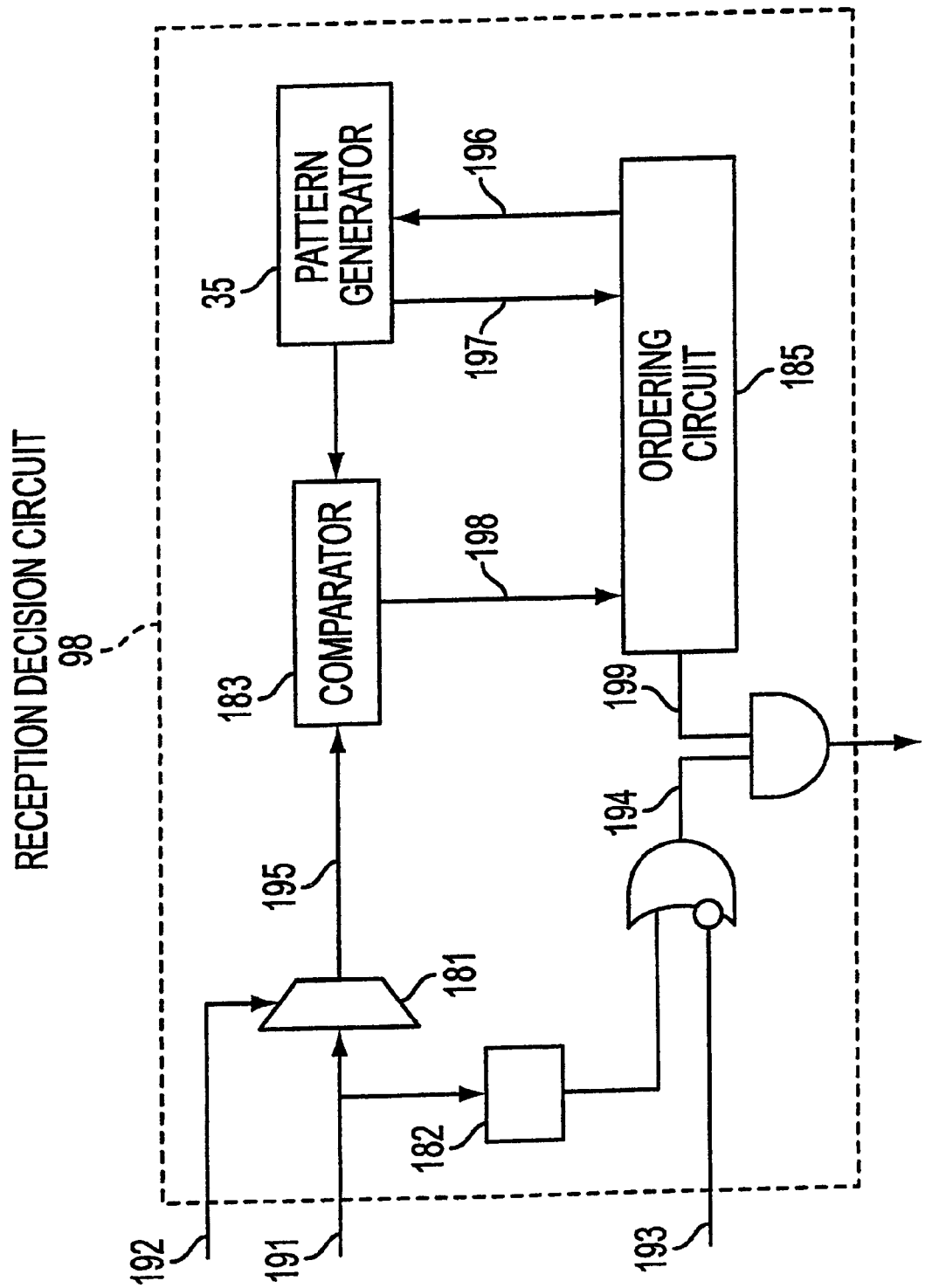
FIG. 6 is a diagram illustrating a reception determination circuit in accordance with embodiments of the present invention.

FIG. 6 is a block diagram illustrating an example of the reception decision circuit 98 in accordance with embodiments of the present invention. A plurality of signals 191 from the synchronization flip-flops 34 are input into the reception decision circuit 98. The plurality of signals 191 that are input to the reception decision circuit 98 are branched into two (2) and are input into a selection circuit 181 and an agreement decision circuit 182, respectively.

From among the plurality of signals 191 that are input to the selection circuit 181, the selection circuit 181 selects the input from one of the signal lines based on a select signal 192 from the control unit 101 and outputs the selected signal to a comparator 183 as a comparison target signal 195.

The agreement decision circuit 182 determines whether or not all of the plurality of signals that are input have the same value and outputs a signal indicative of whether the signals have the same value. The output from the agreement decision circuit 182 undergoes logical sum calculations with a compare signals designation 193 provided from the control unit 101, and the result of the logical sum calculation is output as an agreement between signals signal 194.

Normally, the pattern generator 35 outputs and repeats a fixed pattern signal. However, if a reset signal 196 is asserted to the pattern generator 35, the pattern generator 35 restarts the output of signals from the beginning of the fixed pattern. The pattern generator 35 outputs a full round completed signal 197 when the fixed pattern output has generated one full round or cycle of the fixed pattern.

The comparator 183 compares the comparison target signal 195 with the fixed pattern signal from the pattern generator 35, and outputs a signal agreement signal 198 if they agree. The signal agreement signal 198 and the full round completed signal 197 are input into an ordering circuit 185. If the full round completed signal 197 is asserted when the signal agreement signal 198 is asserted and that input sustains, the ordering circuit 185 outputs a synchronization signal 199. Furthermore, if there is no assertion of the signal agreement signal 198 to the ordering circuit 185, then the ordering circuit 185 outputs a reset signal 196 to the pattern generator 35.

In accordance with the reception decision circuit 98 described above, the synchronization signal 199 from the ordering circuit 185 is obtained by seeking agreement for the one signal selected from among the plurality of signals 191 during one full round of the specified pattern. The reception decision circuit 98 finally outputs the results of a logical product calculation of the synchronization signal 199 and the agreement between signals signal 194. The agreement between signals signal 194 is always ON if the compare signals designation 193 from the control unit 101 has not been set. Consequently, when determining whether or not normal reception is possible for one of the plurality of signal lines 191 that have been received, the control unit 101 can detect the output from the reception decision circuit 98 without setting the compare signals designation 193.

After the specification of the phase region that can be received normally for all input signals and the amount of delay of the signals has been adjusted, the reception of signals is synchronized for all signal lines in response to the control unit 101 resetting the compare signals designation 193, and it can be confirmed that normal reception is possible.

The control unit 101 will now be described below with reference to the block diagram shown in FIG. 10.

Figure 10:
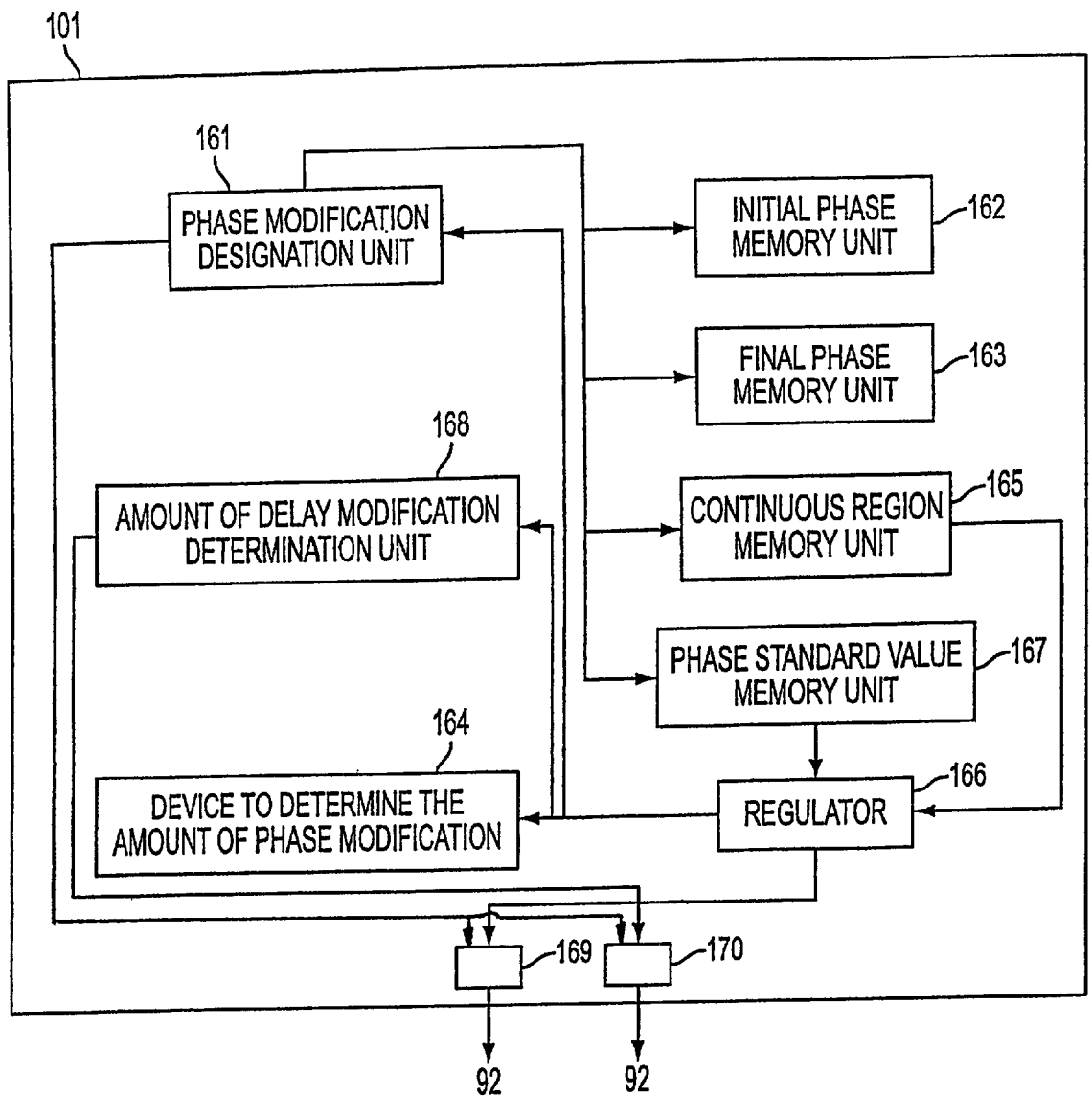
FIG. 10 is a block diagram of a control unit in accordance with embodiments of the present invention.

As shown in FIG. 10, the control unit 101 includes a phase modification designation unit 161 that, for all signals, detects the upper and lower limits of the amount of phase modification of a region, among the stable phase regions, having a continuous region width of a specified value or more, and decides on a phase standard value to determine the amount of delay adjustment. A phase standard value memory unit 167 stores the phase standard value.

An amount of delay modification determination unit 168 sets, for all signals, the amount of delay adjustment such that the lower limit of the amount of phase modification of a region, among the stable phase regions, having the continuous region width of the specified value or more is the phase standard value.

An initial phase memory unit 162 stores the lower limit of the amount of phase modification of the region, among the stable phase regions, having the continuous region width of a specified value or more.

A device to determine the amount of phase modification 164 determines the amount of sampling phase modification from the lower limit and upper limit values of a region, among the stable phase regions, having the continuous region width of the specified value or more when all signals are simultaneously targeted.

A final phase memory unit 163 stores the upper limit of the amount of phase modification of a region, among the stable phase regions, having the continuous region width of the specified value or more.

A continuous region memory unit 165 stores, for every signal, the lower and upper limits the amount of phase modification of a region, among the stable phase regions, having the continuous region width of the specified value or more.

A regulator 166 unifies and controls the circuits of the control unit 101.

Moreover, the control unit 101 includes a driver 169 to transmit delay adjustment signals 92 that are output from regulator 166 and phase modification designation unit 161 to the delay adjustment circuit 96. A driver 170 transmits the delay adjustment signals 92 output from the phase modification designation unit 161 and the amount of delay modification determination unit 168 to the sampling phase adjustment circuit 91.

An operational process for adjusting the amount of phase modification will now be described below with reference to the flowcharts shown in FIGS. 7–9. The operations for the adjustment of the amount of phase modification are controlled by the control unit 101. An outline of the control unit 101 operations will be described first below.

Figure 7:
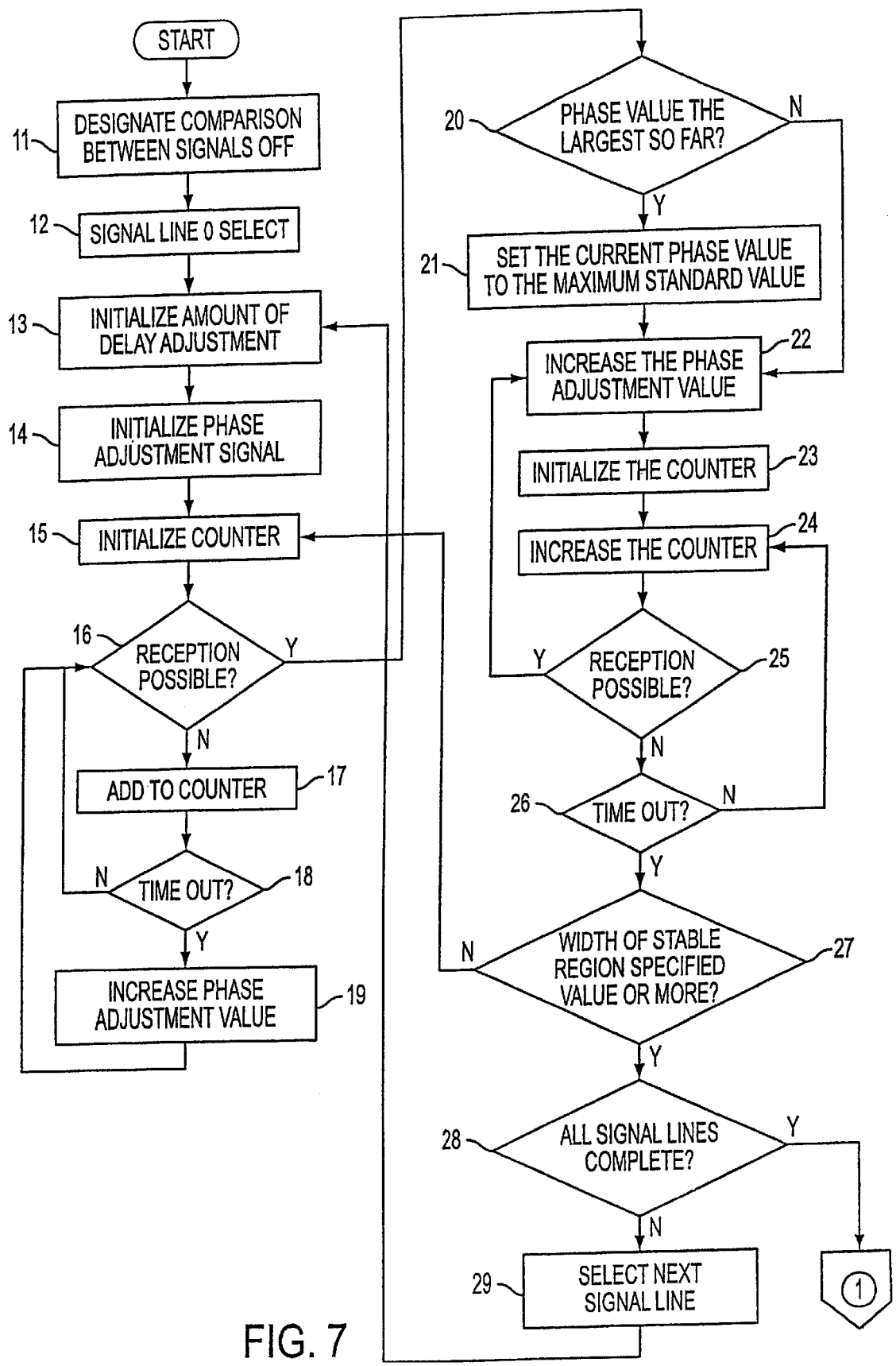
FIG. 7 is a flowchart illustrating operations of a control unit in accordance with embodiments of the present invention.

Initially, the control unit 101 derives the phase standard value for adjusting the phase (operations 11–29 in FIG. 7). Next, the amount of delay of each signal is adjusted (operations 31–45 in FIG. 8). Finally, the final decision on the amount of sampling phase modification is made (operations 46–59 in FIG. 9). A detailed explanation of each operation will now be provided below.

As shown in FIG. 7, the regulator 166 turns the signal to designate comparison between signals 193 to OFF in order to derive the stable phase regions of each signal (operation 11). By doing this, the discrepancies in the phases between signals will have no effect on the determination. The regulator 166 derives the stable phase regions for each signal in order. In accordance with the present embodiment, the adjustment is made starting from signal line 0 (operation 12).

The regulator 166 initializes the amount of delay to be notified to the delay adjustment circuit 96 (operation 13), and initializes the amount of modification notified to the sampling phase adjustment circuit 91 (operation 14). The regulator 166 then causes the phase modification designation unit 161 to begin processing to derive the phase signal standard value for signal line 0.

The phase modification designation unit 161 initializes a monitor timer (operation 15), and begins timeout monitoring. The phase modification designation unit 161 then determines whether or not signals can be received normally (operation 16). If the signals cannot be received normally, it is determined whether there is a timeout (operation 18). If there is no timeout, monitoring of whether or signals can be received normally is continued until there is a timeout (operations 16–18). A specified time is waited to determine whether or not normal reception is possible because a fixed time is required until the reception decision circuit 98 gives notification of the normal status.

If a timeout has been detected without being able to receive signals normally, the phase modification designation unit 161 determines that normal signal reception is not possible at the current amount of phase modification and increases the amount of phase modification (operation 19). The phase modification designation unit 161 repeats the above operations, and seeks out the minimum amount of phase modification that is capable of normal signal reception, specifically, the minimum amount of phase modification of a stable phase region (operations 15–19). The initial phase memory unit 162 stores the minimum amount of phase modification.

When the minimum amount of phase modification of a stable phase region is detected, the phase modification designation unit 161 compares the value of the minimum amount of phase modification with a value that is stored in the phase standard value memory unit 167, and determines whether or not that value is larger than the minimum amount of phase modification of the other signals that have been detected thus far (operation 20). If the newly detected minimum amount of phase adjustment is larger than the value stored in phase standard value memory unit 167, the value in the phase standard value memory unit 167 is updated to the currently detected value (operation 21).

Next, the phase modification designation unit 161 conducts operations to survey the width of the stable phase region. More particularly, the phase modification designation unit 161 further increases the current amount of phase modification (operation 22). Then, the same procedure as used to detect the minimum amount of phase modification is used to detect the amount of phase modification at which signals can no longer be received normally (operations 22–26). This amount of phase modification is the maximum amount of phase modification of the stable phase region.

The phase modification designation unit 161 determines the difference between the minimum amount of phase modification stored in the initial phase memory unit 162 and the maximum amount of phase modification detected, specifically, whether or not the width of a stable phase region is the specified value or more (operation 27). If the width of a stable phase region is less than the specified value, the operational process returns to initialization of the counter (operation 15), and the processing again returns to detecting a stable phase region having a width that is the specified value or more.

If the width of the detected stable phase region is the specified value or more, the phase modification designation unit 161 stores the amounts corresponding to the minimum amount of phase modification and the maximum amount of phase modification at that time in the continuous region memory unit 165, and notifies the regulator 166 that processing has been completed. The regulator 166 determines whether or not the operations of the phase modification designation unit 161 have been completed for all signal lines (operation 28). If the operations have not been completed, the next signal line is selected (operation 29), and processing by the phase modification designation unit 161 is again requested. The regulator 166 conducts the same operations for all signal lines. In accordance with the above operations shown in FIG. 7, the detection of the phase adjustment standard value is completed.

Figure 11:
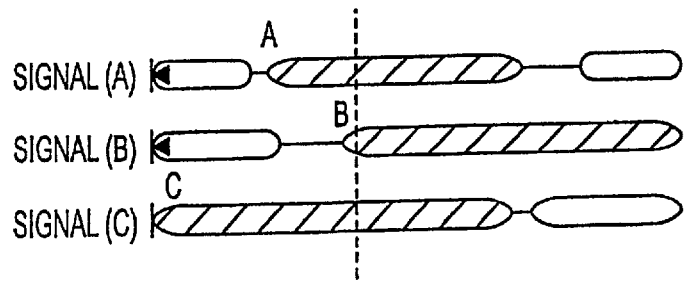
FIG. 11 is a schematic diagram illustrating a stable phase region used to explain the signal phase adjustment device in accordance with embodiments of the present invention.

The operations performed thus far will be summarized with reference to FIG. 11. FIG. 11 illustrates an example of phase modification when there are three signal lines for transmission. As shown in FIG. 11, the horizontal axis represents the amount of phase modification, with the amount of phase modification becoming larger while moving to the right. The portion illustrated in FIG. 11 is the range of one clock cycle of the reception side device 90. In FIG. 11, the part enclosed in an oval is the stable phase region. The stable phase region which is blank inside the oval indicates that the width is less than the specified value, and the stable phase region indicated by the slanting lines inside the oval indicates that width is the specified value or more.

Specifically, in FIG. 11, the minimum amount of phase modification for the signal (A) is the value of point A, the minimum amount of phase modification for the signal (B) is the value of point B, and the minimum amount of phase modification for the signal (C) is the value of point C. Of the minimum amounts of phase modification, the value of point B, which is the largest value, is taken to be the phase adjustment standard value.

The adjustment of the amount of delay for each signal line will now be described with reference to the flowchart shown in FIG. 8.

When the phase adjustment standard value has been determined, the regulator 166 continues with the adjustment of the amount of delay for each signal line. The regulator 166 sets the phase standard value that is stored in the phase standard value memory unit 167 to the sampling phase adjustment circuit 91 (operation 31). The regulator 166 selects signal line 0 (operation 32), and the amount of delay modification determination unit 168 begins operations to detect the delay time that should be set to the signal line 0.

The amount of delay modification determination unit 168 increases the amount of delay notified by delay adjustment signals until normal reception is possible (operations 33–37). When the amount of delay modification determination unit 168 detects that normal reception is possible, the amount of delay is further increased, and the amount of delay that cannot be received normally is detected (operations 38–42). When normal reception is no longer possible, the amount of delay modification determination unit 168 reduces the amount of delay by one stage, and sets the delay adjustment circuit 96 to the reduced value (operation 43).

Figure 8:
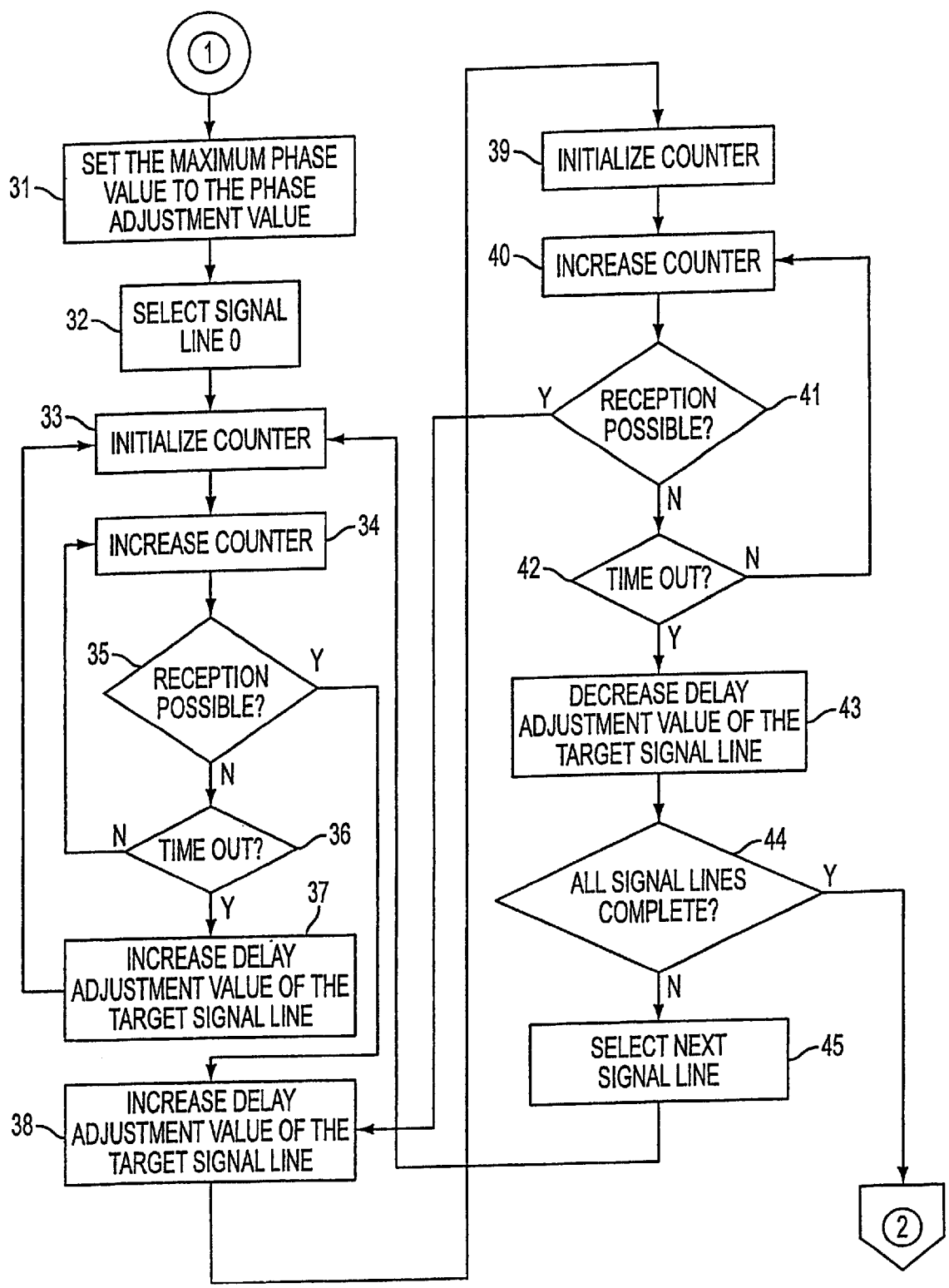
FIG. 8 is a flowchart illustrating operations of a control unit in accordance with embodiments of the present invention.
Figure 9:
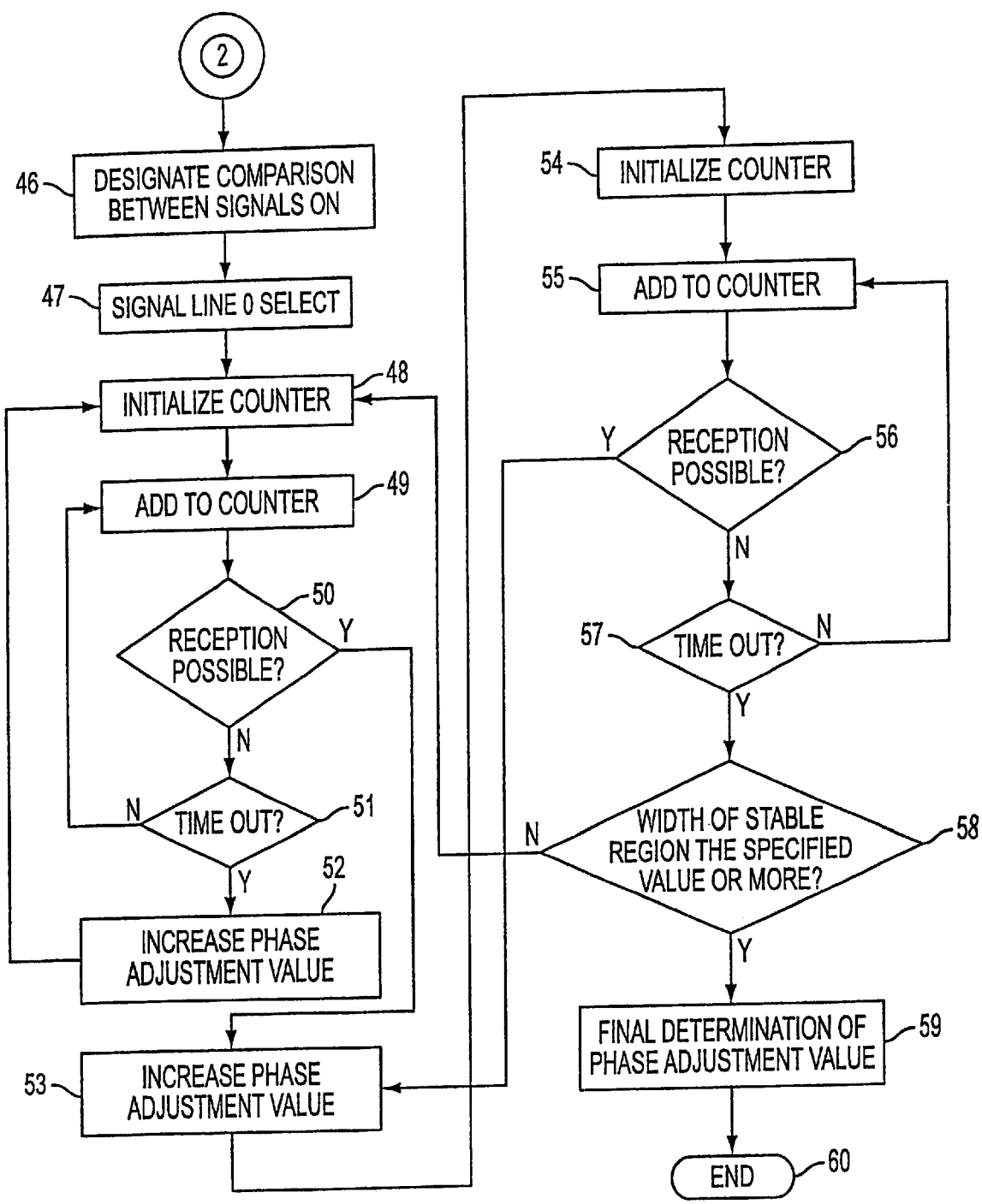
FIG. 9 is a flowchart illustrating operations of a control unit in accordance with embodiments of the present invention.

The above-described operations shown in FIG. 8 complete the setting of the amount of delay for one signal line. The amount of delay modification determination unit 168 then notifies the regulator 166 that processing has been completed. The regulator 166 then determines whether or not the operation of the amount of delay modification determination unit 168 has been completed for all signal lines (operation 44). If processing has not been completed for all signal lines, the next signal line is selected (operation 45), and again a processing request is sent to the amount of delay modification determination unit 168. The regulator 166 conducts processing in the same manner for all signal lines. In accordance with the above operations shown in FIG. 8, the adjustment of the amount of delay for all the signal lines is completed.

Figure 12:
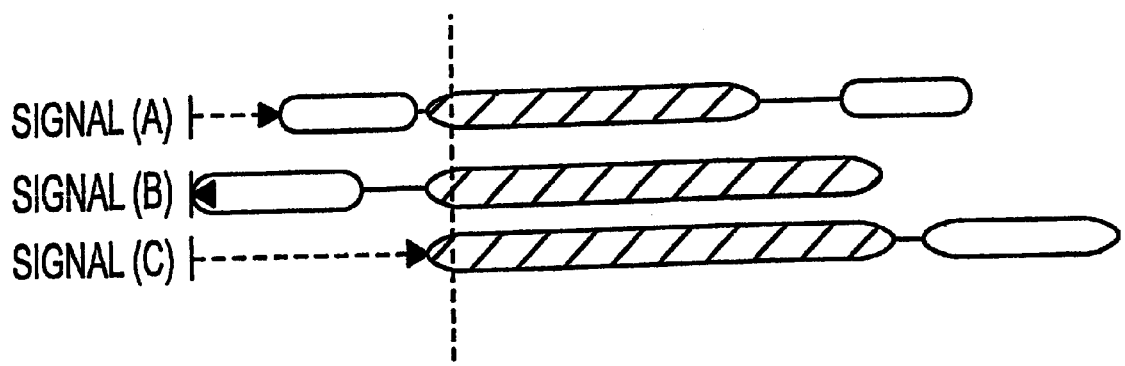
FIG. 12 is a schematic diagram illustrating a stable phase region used to explain the signal phase adjustment device in accordance with embodiments of the present invention.

The operations performed thus far will be summarized with reference to FIG. 12.

As shown in FIG. 12, for signal line (B), the minimum amount of phase modification and the phase adjustment standard value are equal, and therefore signal delay is not necessary and the amount of signal delay is 0. For signal line (A), in order to increase the minimum amount of phase modification from the value of signal (A) to the value of signal (B), the amount of delay must be set by the delay adjustment circuit 96. In FIG. 12, the length of the dotted line arrow is equal to the amount of delay. Furthermore, it is necessary to conduct delay processing for signal (C) in the same manner. By the above operations, the minimum amounts of phase modification of the stable phase regions become the same value (the value of point B shown in FIG. 12).

The adjustment of the amount of delay between signal lines and the detection of the optimum phase modification region have been completed by the operations performed up to this point. Consequently, after this, it is best to decide what value of the stable phase region is to be the amount of sampling phase modification.

However, in accordance with embodiments of the present invention, the following operations are also performed for completeness.

The flowchart shown in FIG. 9 will now be discussed below.

Assume that the regulator 166 detects the width of the stable phase region while the values of all signal lines agree. The regulator 166 turns ON the signal that designates the comparison between signals (operation 46). The regulator 166 selects the signal line 0 (operation 47), and gradually increases in order the amount of phase adjustment to be designated to the phase adjustment circuit 91. The regulator 166 stores the amount of phase modification that is capable of normal signal reception (operations 48–52). This value is the minimum amount of phase adjustment of the stable phase region.

The regulator 166 further increases the amount of phase modification in order until signals can no longer be received normally (operations 53–57). The regulator 166 derives the difference between the minimum amount of phase adjustment that is stored and the amount of phase modification when signals can no longer be received normally, and it is determined whether or not this difference is equal to or greater than the width of the most narrow stable phase region which is stored in the continuous region memory unit 165 (operation 58). As a result of this determination, if the difference currently derived is smaller than the stored value, the processing returns to operation 48, and the detection of the stable phase region recommences. If the difference currently derived is greater than the stored value, this means that the reception side device 90 is in the targeted reception state, and therefore the regulator 166 proceeds to determine the final amount of sampling phase modification (operation 59).

The decision procedures used to determine the final amount of sampling phase modification will be explained below. For example, consider when voltage fluctuations are produced in a system capable of transmitting by continuing the amount of phase modification at normal voltage from 10 to 100. The central value of the normal voltage continuous region from 10 to 100 is 55. If the voltage becomes +10%, normal transmission is possible continuously from 11 to 110, and when the voltage becomes −10%, the continuous transmission range is from 9 to 90. In this situation, the voltage margin is the maximum when the amount of sampling phase modification is set to the center from 10 to 90, specifically, 50, which is a common part of the three continuous regions. Consequently, in this situation, the regulator 166 finally designates the adjustment value 50 to the phase adjustment circuit 91, and processing is completed.

Figure 13:
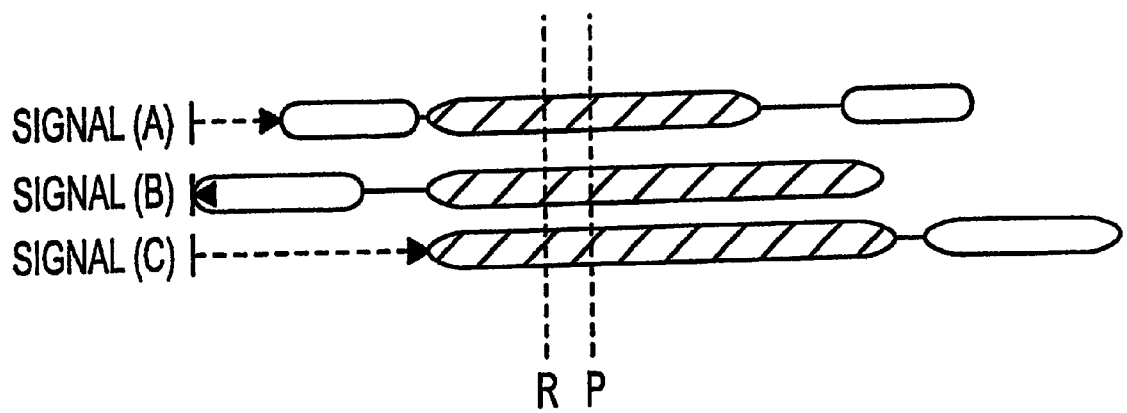
FIG. 13 is a schematic diagram illustrating a stable phase region used to explain the signal phase adjustment device in accordance with embodiments of the present invention.

The status of the processing completed thus far will be summarized with reference to FIG. 13.

In FIG. 13, the stable phase region is most narrow in the signal (A). Consequently, the amount of sampling phase modification is determined from the minimum amount of phase adjustment and the maximum amount of phase adjustment of the stable phase region of the signal (A). The central point of the stable phase region of signal (A) is the point P in the diagram. Then, the point actually determined to be the amount of sampling phase modification is the point R in the diagram.

In accordance with the embodiments described above, the amount of delay is set to the delay circuit 96 corresponding to each signal line of the reception side device 90, and the amount of sampling phase modification set to the phase adjustment circuit 91 are the optimum amounts.

Further, in accordance with embodiments of the invention, a mechanism to detect the change from a satisfactory reception determination to an unsatisfactory reception may be provided, and with such a mechanism it is possible to detect momentary unsatisfactory transmission generated when the amount of delay and the amount of phase modification change by a value not recognized to be a minimum modification unit of the circuit.

Furthermore, in accordance with embodiments of the present invention, it is possible to detect cable connection problems by transmitting an inverted pattern on some signal lines, substituting the inverted signals in a fixed order, and receiving and determining the signals in consideration of the inverted order.

Moreover, in accordance with embodiments of the present invention, it is possible to detect unsatisfactory transmission caused by characteristic pattern noise by including a series of various 0's and 1's in a specified pattern for adjustment.

Still further, in accordance with embodiments of the present invention, by providing a transmission route having multiple modes for signal connection with some of the transmission signals connected only by a specific connection mode, it is possible to provide a common adjustment procedure, irrespective of the signal connection mode, by providing a mechanism that uses a signal not connected by the specified mode to mask the reception determination results by the mode signal, and by excluding the results from the reception determination target when the signal is unconnected.

Further, in accordance with embodiments of the present invention, in addition to the system used in normal transmission, two separate transmission systems for observation that provide a sampling clock adjustment circuit and a reception determination circuit (referred to hereinbelow as "observation systems") may be provided. Transmission errors may be monitored by transmitting in the two observation systems using a sampling clock that displaces the phase forward and a sampling clock that displaces the phase backward in relation to the sampling clock used in transmission. When a transmission error is generated by the observation system of one side, the sampling clock of the system that uses normal transmission approaches a fixed width in relation to the phase of the sampling clock of the observation system in which the error did not occur. The phases of the sampling clocks in the two observation systems may be varied by the same width in the direction. By doing this, it is possible to modify the sampling clock automatically corresponding to variations of the external environment.

In accordance with embodiments of the present invention, it is possible to conduct extremely stable transmission processing in relation to outside disturbances in information processing devices that operate at high-speed frequencies. Furthermore, the stability in relation to manufacturing errors of the transmission route may also be improved.

Moreover, in accordance with embodiments of the present invention, a drop in processing capacity caused by system down time and system recovery based on synchronization discrepancies of the transmitted data can be prevented, and future technical development can be supported.

Although preferred embodiments of the present invention have been shown and described, it will be appreciated by those skilled in the art that changes may be made in these embodiments without departing from the principle and spirit of the invention, the scope of which is defined in the appended claims and their equivalents.

What is claimed is:

1. A signal synchronization transmission system, comprising:
   a transmission device to output specified pattern signals;
   a transmission route to transmit the specified pattern signals, the transmission device transmitting the specified pattern signals to the transmission route; and
   a reception device receiving signals propagated from the transmission route and further comprising a signal phase adjustment circuit generating a fixed pattern signal which is the same as the specified pattern signals transmitted by the transmission device, the signal phase adjustment circuit further comprising:

a clock phase modification circuit to modify a phase of an input clock signal and to output a phase modified clock signal;

an input signal adjustment circuit to receive an input data signal and to transmit the data signal, and which operates based on the phase modified clock signal output from the clock phase modification circuit;

a reception determination unit to determine a reception status of the data signal transmitted from the input signal adjustment circuit based on a fixed pattern signal and the data signal transmitted from the input signal adjustment circuit; and a control unit to control an amount of phase modification of the clock phase modification circuit based on the determination results of the reception determination unit, wherein the control unit determines an amount of phase modification from upper and lower limits of an amount of phase modification of a region, among stable phase regions, having a continuous region width of a specified value or more.

2. A signal synchronization transmission system as recited in claim 1, wherein the control unit comprises a phase modification designation unit to designate an amount of phase modification in ascending or descending order from a first value to a second value in relation to the clock phase modification circuit, and to detect a minimum amount of phase modification and a maximum amount of phase modification of the stable phase regions having a continuous region width that can receive signals normally of a specified value or more.

3. A signal synchronization transmission system as recited in claim 1, wherein the reception determination unit comprises a selection circuit to select a signal from the plurality of input signals, and to determine that a reception state is normal when the selected signal agrees with a signal having a predetermined fixed pattern, and wherein the control unit detects, for each signal selected by the selection circuit, a region having a continuous region width of a specified value or more, from among the regions having an amount of phase modification that can be received normally.

4. A signal synchronization transmission system as recited in claim 1, wherein instead of determining the amount of phase modification from the lower limit and upper limits of the amount of phase modification of a region, among stable phase regions, having a continuous region width of a specified value or more, rather, the amount of phase modification is determined from the lower limit and upper limit amounts of the amount of phase modification of a location that can receive all signals normally, among the continuous regions wherein all the signals are the same, and having a largest continuous region width.

5. A signal synchronization transmission system as recited in claim 1, wherein a plurality of data signals are input to the input signal adjustment circuit, and the input signal adjustment circuit further comprises an input delay circuit to delay the respective input data signals by a specified amount, wherein:

the control unit detects stable phase regions of the respective input data signals having a continuous region width of a specified value or more;

the control unit comprises an amount of delay modification determination device and a device to determine the amount of phase modification, wherein the amount of delay modification determination device determines a phase modification standard value as a maximum value from among minimum amounts of phase modification of continuous regions; and the amount of delay modification determination device establishes an amount of delay for each input data signal, such that a minimum amount of phase modification of a region, among the stable phase regions, having a continuous region width of the specified value or more agrees with the phase modification standard value, wherein the device to determine the amount of phase modification determines the optimum amount of sampling phase modification from a lower limit and an upper limit of the amount of phase modification of a location that can receive all signals normally, among the continuous regions wherein all the signals are the same, and having a continuous region width of a specified value or more.

* * * * *

UNITED STATES PATENT AND TRADEMARK OFFICE
CERTIFICATE OF CORRECTION

PATENT NO. : 6,586,983 B2
DATED : July 1, 2003
INVENTOR(S) : Jun Tsuiki et al.

It is certified that error appears in the above-identified patent and that said Letters Patent is hereby corrected as shown below:

<u>Title page,</u>
Item [62], Related U.S. Application Data, change "2002" to -- 2000 --.

Signed and Sealed this

Twenty-third Day of December, 2003

JAMES E. ROGAN
*Director of the United States Patent and Trademark Office*